US006252414B1

United States Patent
Boyette, Jr. et al.

(10) Patent No.: US 6,252,414 B1
(45) Date of Patent: Jun. 26, 2001

(54) METHOD AND APPARATUS FOR TESTING CIRCUITS HAVING DIFFERENT CONFIGURATIONS WITH A SINGLE TEST FIXTURE

(75) Inventors: James Edward Boyette, Jr., Delray Beach, FL (US); Jiann-Chang Lo, Cupertino, CA (US); Yuet-Ying Yu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/140,225

(22) Filed: Aug. 26, 1998

(51) Int. Cl.$^7$ .................................................. G01R 31/02
(52) U.S. Cl. .......................................... 324/758; 324/754
(58) Field of Search .................................... 324/758, 754, 324/72.5, 158.1, 757, 765, 755; 439/482; 257/48, 40; 438/14–18

(56) References Cited

U.S. PATENT DOCUMENTS

| | | | |
|---|---|---|---|
| 3,614,736 | 10/1971 | McLaughlin et al. | 340/144.3 Q |
| 4,201,939 | * 5/1980 | Lee et al. | 324/72.5 |
| 4,219,771 | * 8/1980 | Reid et al. | 324/72.5 |
| 4,362,991 | * 12/1982 | Carbine | 324/754 |
| 4,906,920 | 3/1990 | Huff et al. | 324/158 P |
| 5,148,103 | 9/1992 | Pasiecznik, Jr. | 324/72 S |
| 5,313,157 | 5/1994 | Pasiecznik, Jr. | 324/158 P |
| 5,355,079 | 10/1994 | Evans et al. | 324/754 |
| 5,436,568 | 7/1995 | Woith | 324/758 |
| 5,461,326 | 10/1995 | Woith et al. | 324/758 |
| 5,469,072 | 11/1995 | Williams et al. | 324/754 |
| 5,506,510 | 4/1996 | Blumenau | 324/754 |
| 5,604,446 | 2/1997 | Sano | 324/758 |

FOREIGN PATENT DOCUMENTS 8-146101   6/1996   (JP) .

OTHER PUBLICATIONS

IBM Technical Disclosure Bulletin, Dendritic Circuit Reroute Applique, vol. 38, No. 05, May 1995, pp. 97–98.
IBM Technical Disclosure Bulletin, Improved Interconnection Structure, vol. 31, No. 6, Nov. 1998, pp. 17–19.

* cited by examiner

*Primary Examiner*—Vinh P. Nguyen
(74) *Attorney, Agent, or Firm*—Ronald V. Davidge; Richard A. Tomlin

(57) ABSTRACT

A fixture for testing circuits includes a rectangular array of conductive test pads, alternating with insulating areas in a checkerboard-like pattern. In a first embodiment, the entire array is printed on a central portion of a plastic membrane, with outer portions of the membrane carrying electrical lines from the test pads to connectors. In a second embodiment, the rectangular array is formed on surfaces of a number of closely packet plastic membranes, each of which has tabs extending away from the testing surface to connectors. The test fixture is generic, not being configured for testing a particular circuit configuration. To compensate for conditions of linear misalignment, the rectangular array is moved in a raster pattern having a size equal to the cell size of the rectangular array. To compensate for conditions of angular misalignment, the array may be rotated after such misalignment is measured, or test results may be compared with exemplary data for a number of misalignment conditions.

9 Claims, 4 Drawing Sheets

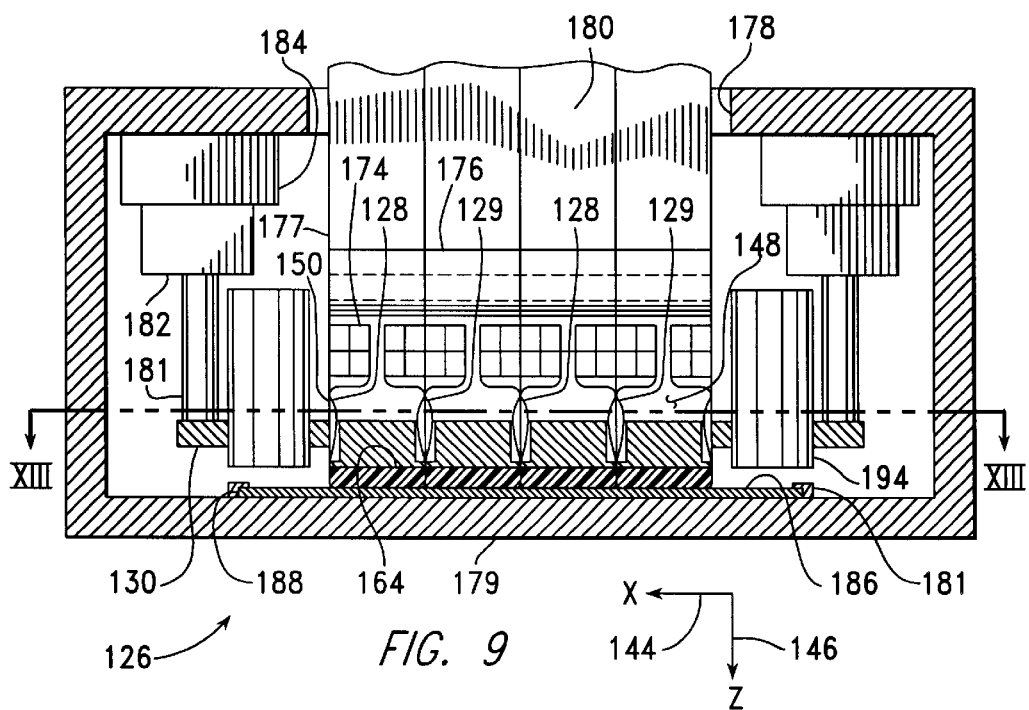
FIG. 9
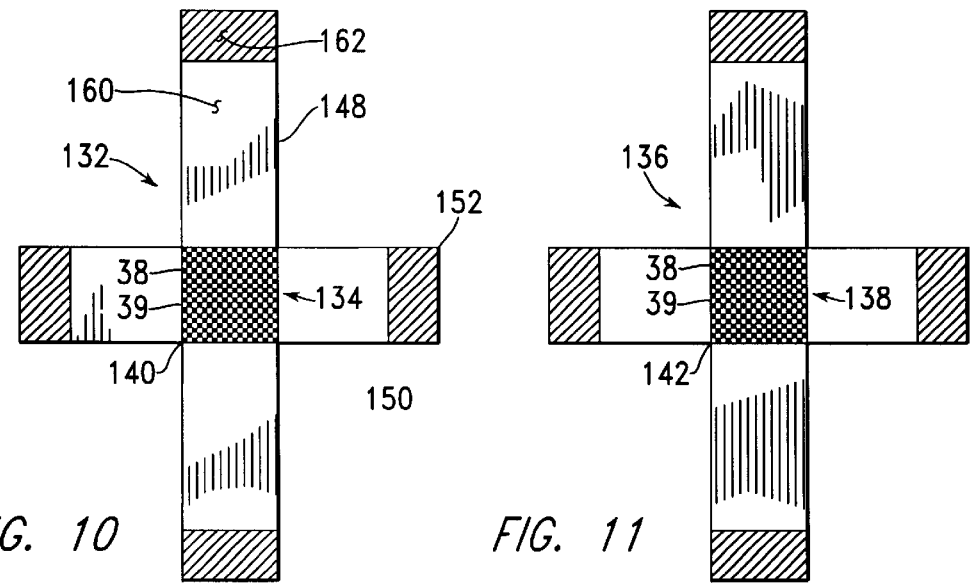
FIG. 10
FIG. 11

METHOD AND APPARATUS FOR TESTING CIRCUITS HAVING DIFFERENT CONFIGURATIONS WITH A SINGLE TEST FIXTURE

BACKGROUND OF THE INVENTION

1. Field of the Invention

This invention relates to apparatus for testing unpopulated printed circuit boards, and, more particularly, to such apparatus including a generic pattern of test points, not specific to the particular type of card being tested.

2. Background Information

A number of methods are used to test unpopulated printed circuit boards for shorts and opens. In general, boards are generally tested either through the use of a specialized fixture having a spring-loaded probe point at each circuit pad to be contacted during the test process, called a "bed of nails" circuit tester, or through the use of a flying-probe circuit tester, which has a relatively small number of probe points, typically one to four, moving rapidly among the points to be tested.

The general method used with either of these types of test probes is to apply a test voltage to only one of the circuit pads and to look at each of the other circuit pads to determine if the test voltage has been conducted to it through the circuit card. That is, each pair of circuit pads on the circuit board is checked to determine if there is a circuit connection therebetween. In a board having N test points, the number of tests required by this method is given by T in the following equation:

$$T = \frac{N(N-1)}{2} \quad \text{1)}$$

The results of this test are compared with data for a circuit board of the type being tested which is known to be good. If one or more of the circuit connections which are supposed to be present is in fact absent, the circuit board is rejected as having one or more open conditions. On the other hand, if one or more of the circuit connections which is supposed to be absent is in fact present, the circuit board is rejected as having one or more shorted conditions. If neither of these failure conditions is present, the circuit board is accepted as having passed the test process A particular problem with the "bed of nails" testing approach is that a complex test fixture must be built for each type of circuit board to be tested. Furthermore, the close spacings of circuit features, including circuit pads, on modern circuit boards makes the construction of such test fixtures difficult, or even impossible, due to the space requirements of the spring-loaded pins. While the method of flying probes allows the same probing apparatus to be used for many different types of circuit boards, the time required for probe movement makes this method much to slow for many circuit testing applications. Also, both methods require the precise alignment of the individual circuit boards with the test apparatus so that circuit boards are contacted correctly. This alignment is becoming increasingly difficult as circuit pad spacings are reduced.

Thus, what is needed is a method allowing the use of a single, generic test fixture for the application of test voltages to test pads in a large number of different types of circuit cards, including cards with close pad spacings. Furthermore, what is needed is a circuit testing method alleviating the need for accurate placement of the circuit board within a testing fixture.

A number of U.S. Patents describe testing fixtures having flexible membranes with printed circuit pads arranged to contact particular features on circuits to be tested. This method provides for the placement of test pads at much closer spacings than those achievable with spring-loaded test points 20, allowing the fixtures to address the problems of testing integrated circuit substrates. Also, in many instances, such test fixtures are less expensive to build than the traditional "bed-of-nails" fixtures, with easily-replaceable membranes being used. Such patents include U.S. Pat. Nos. 4,906,920, 5,148,103, 5,313,157, 5,355,079, 5,436,568, 5,461,326, and 4,469,072. Nevertheless, this method requires specialized fixtures for the various different types of circuit substrates being tested, with each fixture having test pads located at the specific locations of circuit pads on the substrate to be tested. Furthermore, the circuit being tested must be located very accurately relative to the test fixture, so that each circuit pad on the circuit being tested contacts the appropriate pad of the test fixture and no adjacent pads of the test fixture.

U.S. Pat. No. 5,506,510 describes the use of a generic probe fixture in an automatic circuit board tester. The fixture includes a high-density array of probe pads, which are sized and spaced apart to ensure contact with all of the test points on the device under test. The width of the probe pads is made smaller than the known minimum separation of the test points, and the separation of the probe pads is made smaller than the known width of the test points. While this fixture structure results in the possibility that more than one probe pad will contact the same test point, each of the test points makes contact with at least one probe pad.

The method of U.S. Pat. No. 5,506,510 requires an extremely high density of probe pads for typical circuit testing applications. This density requires a very large number of associated circuits, such as multiplexers, within the test equipment, increasing the cost of the equipment and slowing the testing process. This density is generally too high to allow the placement of the test pads and associated circuit lines on a flexible membrane, since the resulting density of the circuit lines is too high to allow the manufacture of a practical flexible printed circuit. The apparatus described in the patent includes a rigid assembly of test pads, from which individual wires extend, with reliance being placed on the deflection of a flexible circuit assembly being tested to make electrical contact at all of the test points. A vacuum arrangement is described for causing the deflection of the flexible circuit assembly in this manner. This requirement for sealing and deflection places limitations on the types of circuit assemblies which can be tested within the apparatus.

What is needed is a method providing a generic test fixture having a pattern of probe pads which is of a low enough density to allow placement of the pads and associated circuit lines on a flexible membrane. Such a test fixture could be used to test circuit substrates of a wide variety, including both rigid and flexible substrates without a need for precisely positioning the substrate being tested relative to the test fixture. Furthermore, such a test fixture would provide the advantages associated with an easily replaceable fixture portion contacting the circuits being tested.

A number of techniques have been developed and described for recognizing patterns in the non-analogous field of optical pattern recognition. Descriptions of various of these techniques are provided, for example, in U.S. Pat. No. 3,614,736, which discloses a pattern recognition system which will recognize patterns irrespective of their translation, rotation, or scale change. Input data may be provided by a scanner or other suitable data source. Means for calculating the center of gravity, or alternately the autocorrelation function are provided which can be employed, so that the data can be transformed for an actual or simulated annular or equivalently radial scan, with exponential spacing along radii. Alternatively, a straightforward raster scan may be employed for recognition which is invariant to translation only. The output is then processed in means for cross-correlating with known patterns.

What is needed is a means for gathering circuit test data, relative to short and open circuit conditions, through the use of a generic fixture, not specific to the type of circuit being tested, and cross correlating such data with similar data measured using a known good circuit.

SUMMARY OF THE INVENTION

It is therefore a first objective of the present invention to provide a means for using a generic test fixture, i.e. a fixture having conductive test pads placed without regard to the specific configuration of the circuit to be tested, to test a number of circuit configurations.

It is a second objective to provide an effective means for compensating for variations in the linear and angular placement of a test fixture relative to a circuit being tested.

According to a first aspect of the present invention, a method is provided for testing a circuit to be tested on a substrate, wherein the circuit to be tested includes a plurality of test areas extending along a surface of the substrate, and wherein the method comprises steps of:

a) clamping the substrate in place within a test fixture;

b) moving a circuit testing assembly into contact with the test areas, wherein the circuit testing assembly includes a first plurality of conductive test pads, and wherein various conductive test pads within the first plurality thereof are moved into contact with various of the test areas;

c) applying a test signal sequentially to various conductive test pads within the first plurality thereof, while forming determinations of whether the test signal is conducted through the circuit to other conductive test pads within the first plurality thereof, and while storing results of the determinations;

d) moving the circuit testing assembly out of contact with the test areas;

e) moving the circuit testing assembly parallel to the surface along a portion of a predetermined pattern of motion; and f) repeating steps b) through e) until movement along the predetermined pattern of motion has been completed.

According to a second aspect of the invention, apparatus is provided for testing a circuit on a substrate, wherein the circuit to be tested includes a plurality of test areas extending along a surface of the substrate, and wherein the apparatus comprises a rectangular array of conductive test pads alternating with insulating surfaces, a Z-actuator, a first XY actuator, and a test circuit. In the rectangular array of conductive test pads, all adjacent conductive test pads and insulating surfaces are spaced at a common cell distance, and all conductive test pads are electrically insulated from one another. The Z-actuator provides relative movement bringing the rectangular array of conductive test pads into alignment with one another and separating the rectangular array of conductive test pads and the substrate from one another. The first XY actuator provides relative movement between the rectangular array of conductive test pads in directions parallel to the surface of the substrate. The test circuit applies a test voltage sequentially to various of the conductive test pads while checking for conduction of the test voltage to various other of the conductive test pads.

BRIEF DESCRIPTION OF THE DRAWINGS

FIG. 9 is a vertical cross-sectional elevation of a circuit test fixture built in accordance with a second embodiment of the present invention;

FIG. 10 is a bottom plan view of a flexible membrane having a first pattern of test pads, included within a first type of testing circuit assembly in the circuit test fixture of FIG. 9;

FIG. 11 is a bottom plan view of a flexible membrane having a second pattern of test pads, included within a second type of testing circuit assembly in the circuit test fixture of FIG. 9;

DETAILED DESCRIPTION

Figure 1:
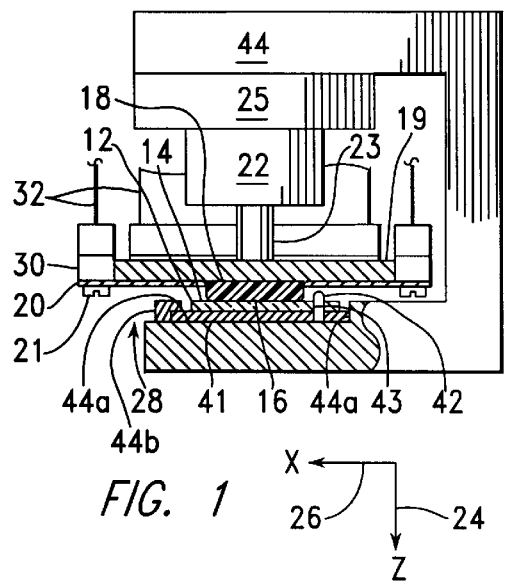
FIG. 1 is a vertical cross-sectional elevation of a circuit test fixture built in accordance with a first embodiment of the present invention.

FIG. 1 is a vertical cross-sectional elevation of a test fixture, generally indicated as 10, built in accordance with a first embodiment of the present invention. The test fixture 10 is held above and adjacent to the substrate 12, including a circuit to be tested on its upper surface 14. The test fixture 10 includes a flexible membrane 16 including test pads and circuit lands, which will be discussed in reference to FIG. 2, an elastomeric pad 18, and a mounting plate 19. The flexible membrane 16 is held in place by means of an insulating frame 20, which is fastened to the mounting plate 19 by means of a screw 21 at each corner. The test fixture 10 also includes a Z-actuator 22, attached to the mounting plate 19 by means of a mounting post 23. The Z-actuator 22 moves the flexible membrane 16 into engagement with the substrate 12 by movement in the Z-direction indicated by arrow 24, and out of engagement with the substrate 12 by movement opposite this direction of arrow 23. An XY actuator 25 moves the Z-actuator 20 in and opposite the X-direction of arrow 26 and in and opposite a Y-direction perpendicular to both the X- and Z-directions. The actuators 22, 25 may, for example, include piezoelectric elements moving in accordance with applied voltage levels. The test fixture 10 further includes well-known elements, such as bushings and shafts, as needed to constrain the directions of movement of the flexible membrane 16.

The flexible membrane 16 forms part of a testing circuit assembly, generally indicated as 28, including a number of connectors 30 soldered to the membrane 16 so that electrical connections between flexible circuit cables 32, extending to switching and measurement circuits (not shown) within the testing apparatus, are made to individual circuit test pads within the membrane 16.

Figure 2:
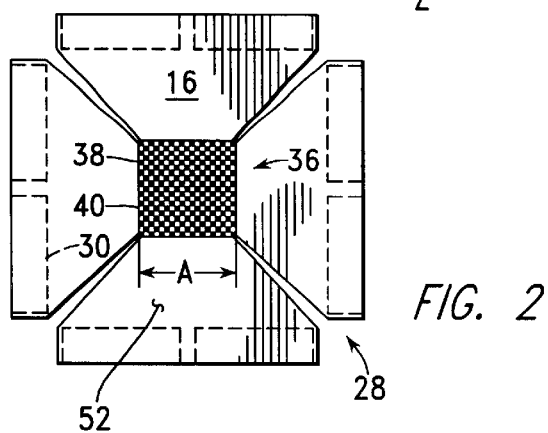
FIG. 2 is a bottom plan view of a testing circuit assembly within the circuit test fixture of FIG. 1.

FIG. 2 is a bottom plan view of the testing circuit assembly 28. The flexible membrane 16 includes a central depressed portion 34 having, on its lower surface, a checkerboard pattern 36 of individual contact pads 38, alternating with insulating surfaces 39.

Referring to FIGS. 1 and 2, the substrate 12 is preferably held in place within the test apparatus 10 by means of fixturing providing an accurate relationship between the pattern 36 of contact pads 38 and the circuit to be tested on the substrate 12. For example, the substrate 12 is located on a mounting fixture 41 by means of pins 42 extending through holes 43 in the substrate 12. In the process of manufacturing the substrate 12, the circuit to be tested is accurately located relative to the holes 43. The fixture 41 is removably attached to a frame 44, being clamped against surfaces 44a by means of a releasable clamping mechanism 44b to assure repeatable location following removal and reinstallation.

Figure 3:
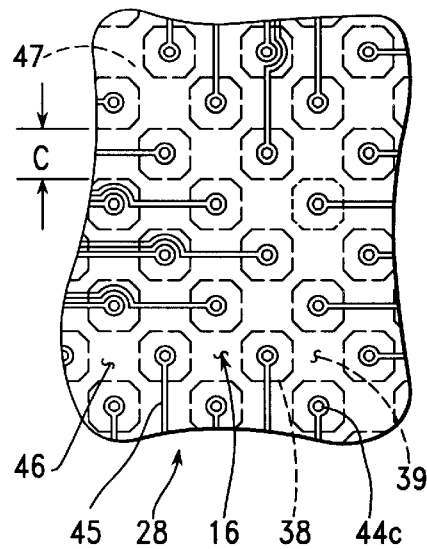
FIG. 3 is a fragmentary top plan view of a central portion of the circuit testing assembly of FIG. 2.

FIG. 3 is a fragmentary top plan view of a central portion of the testing circuit assembly 28. The flexible membrane 16 is preferably composed of a polyimide substrate, with a thickness of approximately 50 microns (0.002 inch), having a via hole 44c adjacent each of the individual contact pads 38, and having a conductive pattern of plated copper. The conductive pattern of plated copper includes the individual contact pads 38, plating through each via hole 44c, and a circuit line 45 extending along the upper surface 46 of the flexible membrane 16 to an associated connector 30. The circuit test pads 38 must not touch one another, so that individual electrical tests can be applied through each test pad 38. Thus, diagonally adjacent test pads 38 are separated by a gap 47 in the conductive pattern of plated copper.

Figure 4:
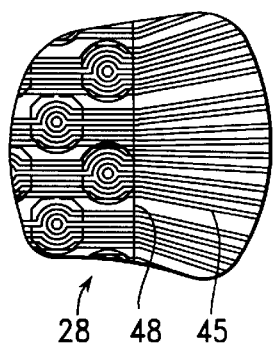
FIG. 4 is a fragmentary top plan view of a portion of the circuit testing assembly of FIG. 2 around an edge of a depressed central portion of this assembly.

FIG. 4 is a fragmentary top plan view of a section of the testing assembly 28 extending from an edge 48 of the depressed central portion 34. While adjacent circuit lines 45 extend parallel to one another within the depressed central portion 34, these lines 45 fan apart from one another as they extend outward, toward the associated connectors 30 (shown in FIG. 2). In this way, at the connectors 30, the spacing between the terminals (not shown) in the connectors 30 is matched by the distance between adjacent circuit lines 45, with each line 45 being attached to an associated connector terminal by solder.

Figure 5:
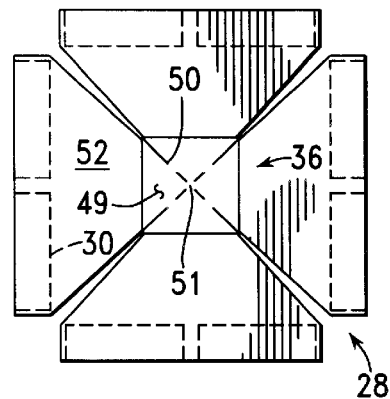
FIG. 5 is a pictorial bottom plan view of the circuit testing assembly of FIG. 2, showing a division of circuit testing elements into quadrants.

FIG. 5 is a pictorial bottom plan view of the testing circuit assembly 28, showing the test pad pattern 36 as being divided into four triangular quadrants 49, as indicated by dashed lines 50. Each quadrant extends outward from a pattern center 51. The electrical connections from each quadrant 48 are routed through an adjacent segment 52 to adjacent connectors 30.

Referring again to FIGS. 1, 3, and 5, in order to assure that all test points on the circuit to be tested are contacted by the circuit test pads 38, the test pad pattern must be somewhat larger than the circuit being tested. The size of each cell, indicated by "S" in FIG. 3, is preferably equal to the center-to-center distance of the smallest features expected to be tested. Since the test pad pattern 36 is formed using the same manufacturing process as the circuit pattern to be tested on the substrate 12, it is expected that the test pad pattern 36 can readily be sized in this way.

The overall size of the test pad pattern 36, indicated by "A" in FIG. 2, is limited by the cell size "C," in accordance with a need to extend each test circuit line 45 outward from its associated test pad 38 to an adjacent area 52 outside the depressed central area 34. Due to this need, the maximum pattern size "A" is determined by the allowable density of circuit lines 45 extending outward from the test pad pattern 36.

For example, a cell size, shown as "C" in FIG. 3, is chosen to be 0.457 mm (0.018 inch). The spacing between centers of adjacent lines 45 can be 51 microns (0.002 inch), indicating that nine lines 45 can be carried within a single row comprised of alternating test pads 38 and insulating spaces 39. However, presence of via holes 44c within the circuit pattern reduces the number of lines which can be carried within such a row to eight. Since, in each row of test pads, half of the cells are occupied by test pads 38, while the remaining cells are occupied by insulating spaces 39, eight test pads 38 indicate that a length of 16 cell spacings "C" is accommodated. Furthermore, in the configuration of the lines 45, the various lines are fanned outward from the central regions, which would otherwise be the most dense, providing a relatively constant density of lines crossing each edge 48 of the central depressed area. This form of optimization again doubles the number of cells which can be accommodated by a given line spacing, taking advantage of the fact that each quadrant 49 has only half the area of a rectangle having the same width (A) and height. Thus, there can be 32 cell spacings "C" in the pattern 36 between its edge 48 and the pattern center 51. Since these cell spacings make up only half of the distance "A," there are a total of 64 cell spacings along each row or column comprising the total width "A." With each of these cell spacing "C" being 0.457 mm (0.018 inch), The total distance "A" is determined to be 29.26 mm (1.152 inches).

Thus, in this example, the test pad pattern 36 includes 64 rows, each of which has 32 contact pads 38 and 32 insulating surfaces 39, providing a total of 2048 contact pads in the pattern 36. The number of tests required to check for connections among N contact pads 38 is given by Equation 1). Using all the 2048 contact pads of the present example, 2,096,128 tests are required. A method for reducing the number of tests required will be discussed with reference to FIG. 7.

The preceding discussion has assumed that the membrane layer 16 has only a single insulating layer with contact pads 38 on one side and circuit lines 45 on the other side. Alternately, the membrane layer 16 may be composed of two or more insulating layers having one or more additional layers of circuit lines 45, with vias connecting the circuit lines 45 on each layer thereof with corresponding contact pads 38. This approach has the advantage of increasing the number of circuit pads 38 of a particular size which can be connected with the connectors 30 through the circuit lines 45. In other words, a larger pattern 36 of circuit pads 38 can be accommodated without increasing the size of each individual circuit pad 38. However, this approach has the disadvantage of increasing the stiffness of the membrane layer 16, making it increasingly difficult to ensure that electrical contact is made between each circuit pad 38 and an underlying area used as a test point of the circuit under test.

Figure 6:
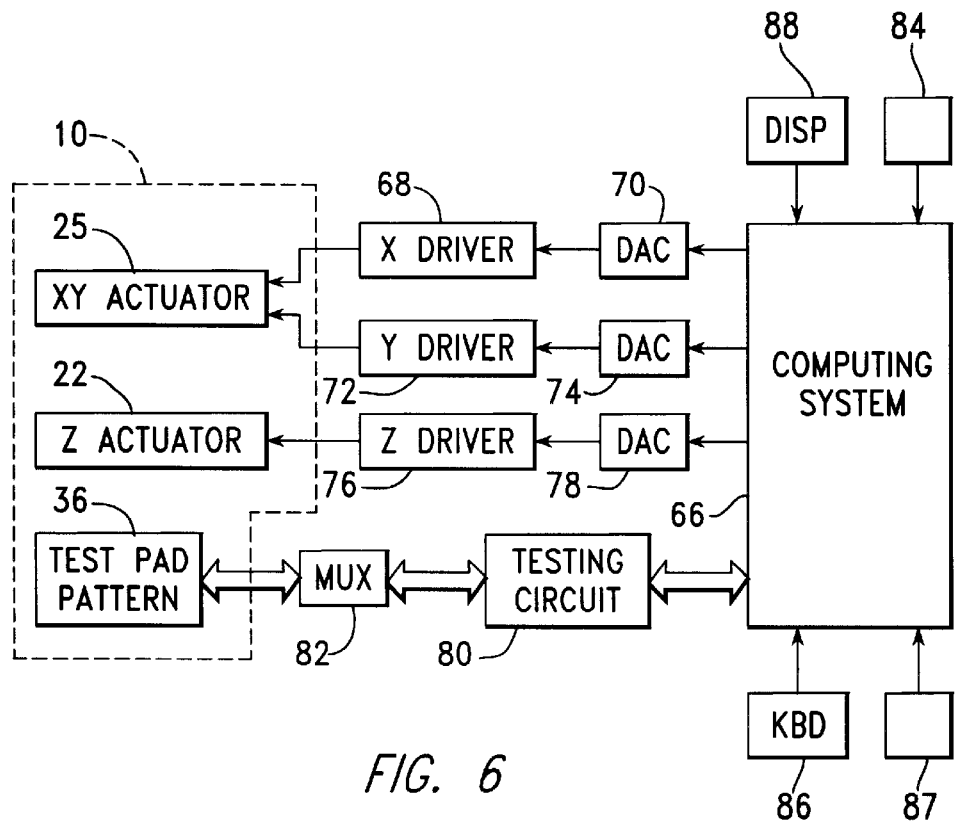
FIG. 6 is a block diagram of a circuit testing system including the circuit test fixture of FIG. 1.

FIG. 6 is a block diagram of a circuit testing system, generally indicated as 64, including the test fixture 10 of FIG. 1.

Referring to FIGS. 1 and 6, the circuit testing system 64 includes a computing system 66 causing the movement of the testing circuit assembly 28 by applying voltage signals to the XY actuator 25 and to the Z actuator 22. A drive signal to the X direction portion of the XY actuator 25 is applied from an X driver circuit 68, to which an output of the computing system 66 is applied through a digital-to-analog convertor 70. Similarly, a drive signal to the Y direction portion of the XY actuator 25 is applied from an Y driver circuit 72, to which an output of the computing system 66 is applied through a digital-to-analog convertor 74. A drive signal to the Z actuator 22 is applied from a Z driver circuit 76, to which an output of the computing system 66 is applied through a digital-to-analog convertor 78.

The computing system 66 also control the testing process by providing inputs to a testing circuit 80, which is connected to each of the test pads 38 in the test pad pattern 36 through a multiplexer 82. During the testing process, a test voltage is applied to one of the test pads 38 through the multiplexers, 82 while the multiplexer 82 is also cycled to contact other test pads 38 to determine if the test voltage is being conducted to these other test pads.

The computing system 66 includes a drive for reading computer readable media 84, such as floppy diskettes. A program to be executed within the computing system 66 is loaded into the system through one or more of such media 84. Furthermore, data corresponding to the circuit to be tested is loaded into the computing system 66 by means of such media 84. The testing system 64 also includes a keyboard 86 and a pointing device 87, such as a mouse, for providing manual inputs to the computing system 66 and a display unit 88 for providing display screen information relating to the testing process.

In accordance with a preferred version of the present invention, a means is provided for limiting the number of contact pads 38 involved in the testing process to those which may come into contact with test points of the circuit under test on the substrate 12. Providing such a limitation greatly increases a throughput rate at which circuits can be tested by reducing the number of tests which must be performed.

Figure 7:
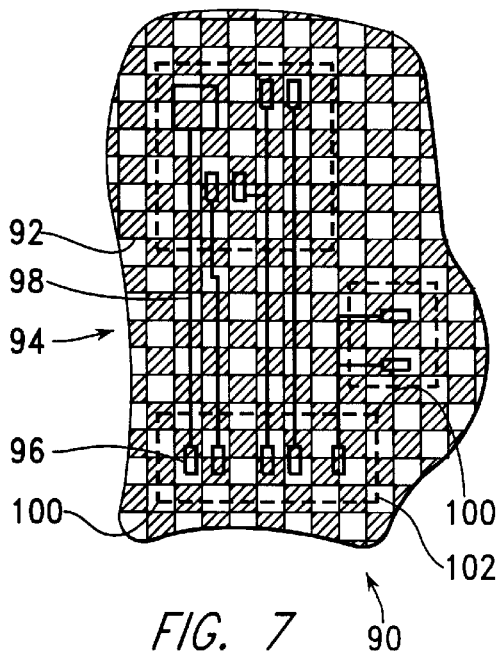
FIG. 7 is a fragmentary view of a display screen presented by the circuit testing system of FIG. 6.

FIG. 7 is a fragmentary view of a display screen 90 presented to the operator to assist in the determination of the contact pads 38 to be used in the test process. This screen 90 includes a pattern of shaded areas 92 corresponding to the conductive test pads 38 of the test pad pattern 36 (shown in FIG. 2). Also incorporated in the display screen 90 is a circuit pattern image 94 corresponding to the particular circuit being tested, located in a nominal position relative to the pattern of shaded areas 92, corresponding to a position in which the circuit under test is expected to be placed relative to the pattern 36 of conductive pads. This circuit pattern 94, which is derived from data provided as an input to the computing system 66 on computer-readable media 84 (shown in FIG. 5), includes a number of areas 96 indicating the physical location and shape of conductive pads serving as test points on the circuit under test and a number of lines 98 connecting these areas 96 in the manner of circuit lines on the circuit under test.

Before the circuit testing process is begun, the operator is provided with an opportunity to indicate which of the various test pads 38 are to be used as part of the circuit test process, using the display screen 90. For each area including test pads to be used in this process, the operator uses the pointing device 87 (shown in FIG. 5) to select a pair of corner points 100 defining a rectangle including various of the test pads 38 to be used in the testing process. After the second of these corner points 100 is selected, the computer draws a rectangle 102 around the shaded areas 92 corresponding to the test pads 38 which were selected. This selection process can be used a number of times to select all of the test pads 38 needed to assure contact with each of the test points represented by the areas 96. This method is generally very effective in reducing the number of test pads 38 to be used, since most circuits on substrates are configured so that the surface area of the pads forming points to be tested occupies a small part of the total surface area, and since such pads are usually clustered on the substrate, leaving large regions without test points.

In selecting the test pads 38 to be used in testing a particular circuit configuration, the operator selects the pads 38 adjacent the areas used as test points, with the circuit to be tested located in a nominal position, as provided by the computing system 66 on display screen 88, together with surrounding pads 38 to account for misalignment. Alternately, this process may occur in an absence of human intervention in accordance with a program executing within the computing system 66 to determine such areas.

Referring again to FIGS. 1, 2, and 6, in a first example of the operation of the testing system 64, the test points of the circuit to be tested on substrate 12 are configured in accordance with the size and spacing of the test pads 38 in the pattern of test pads 36, with the alignment between the test points and the test pads 38 being assured by the mechanical fixturing described above in reference to FIG. 1. In this example, each test point of the circuit to be tested is contacted by one or more test pads 38, with no test pads 38 simultaneously contact more than one test point. In this example, the spatial relationship between each test point of the circuit to be tested and each test pad 38 is uniquely determined, so that the circuit testing process is completed with one series of tests, comprising the number of tests described by Equation 1). The total number of circuit pads 38 involved in the testing process, and hence the total number of tests, may be significantly reduced by the method described above in reference to FIG. 6.

The apparatus is operated to test this first-example type of circuit simply by installing the substrate 12 within the mounting fixture 41, with the testing circuit assembly 28 being held upward, opposite the engagement direction of arrow 24, by means of Z actuator 22. Then, the testing circuit assembly 28 is lowered, in the direction of arrow 24, through the operation of the Z actuator 22. While the testing circuit assembly 28 is held in forcible contact with the circuit under test to assure electrical contact between various circuit pads 38 of the testing circuit assembly 28 and adjacent test points of the circuit under test, the electrical circuit testing process is applied. During this process, for example, a test voltage is applied to each of the circuit pads 38 selected for use, while each of the remaining circuit pads 38 selected for use is examined to determine whether the test voltage is conducted to the pad through the circuit under test. The test data generated in this way is compared with exemplary data describing a satisfactory version of the circuit under test. This exemplary data describes, for example, the test points which should be electrically connected if there are no open circuit connections and if there are no short circuit conditions. This exemplary data may be determined by examination of the configuration of the circuit under test with regard to the circuit test pattern 36, or by applying the circuit testing process to an example of the circuit under test which is known to be good.

On the other hand, a particular advantage of the present invention over prior art methods is achieved in a second example of operation of the testing system 64, when the circuit to be tested is not configured according to the size and spacing of the test pads 38 in the circuit test pad pattern 36. In such an application, certain test pads 38 may simultaneously contact two or more areas used as points in the circuit to be tested. Furthermore, other test points in the circuit to be tested may fall entirely within insulating areas 39 of the test pad pattern 36. For the above reasons, it is not generally possible to determine if all of the test conditions are met within a circuit under test by an application of tests through the test pad pattern 36 with this pattern in a single location adjacent to the circuit under test.

Figure 8:
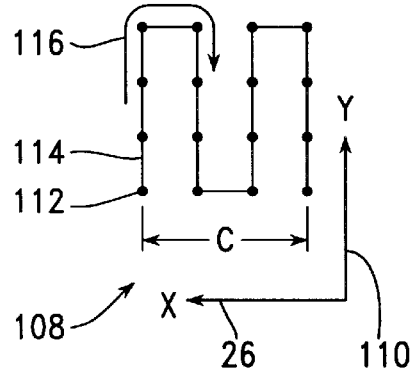
FIG. 8 is a pictorial view of a pattern of movement of the circuit testing assembly of FIG. 2 in a plane parallel to the circuit being tested, during the circuit test process.

FIG. 8 is a pictorial view of a pattern of movement 108 of the testing circuit assembly 28 in the X-direction of arrow 26 and in the Y-direction of arrow 110. These directions are each parallel to the upper surface 14 of the substrate 12 (shown in FIG. 1). A stopping point 112 is represented by each of the dots 112, while a path 114 of motion of the testing circuit assembly 28 is represented by a line. This motion occurs in a raster scanning pattern, along the path 114 in the direction of arrow 116, within a distance corresponding to the cell size "C" in both X- and Y-directions.

Referring to FIGS. 1–3 and 8, with the movements of pattern 108, various conditions, resulting from the fact that the configuration of test points on the circuit under test does not match the test pad pattern 36, which jeopardize the validity of the test, are resolved. For example, if the area forming a test point falls entirely adjacent an insulating area 39 when an initial circuit test is made, the movements of pattern 108 will bring one or two of the conductive test pads 38 adjacent the insulation area 39 into a position at least partly adjacent to the area forming a test point, so that this test point is accessed by the circuit testing process. Additionally, if a single conductive test pad 38 contacts two or more areas forming test points on the circuit under test during initial circuit testing, the movements of pattern 108 cause such areas forming test points to be individually contacted by a single test pad 38, during one or more of the tests applied at stopping points 112.

In the example of FIG. 8, the testing circuit assembly 28 is stopped in sixteen positions, with testing data being taken at each of these positions. The number of stopping positions is determined by the resolution required within the testing fixture 10. This requirement is in turn determined from the minimum size of areas forming test points on the circuit under test and from the minimum spacing between such areas.

Thus, the testing of a circuit of this second-example type on an individual substrate 12 begins when the substrate is placed in the fixture 41, with the testing circuit assembly 28 being held upward by the Z actuator 22. Next, the circuit assembly 28 is lowered with the Z actuator 22 to be forcibly held against the circuit under test. The electrical circuit testing process is then applied to the circuit under test, for example, with a testing voltage being applied sequentially to each of the test pads 38 previously chosen to be part of the testing process, and with each of the other test pads 38 being checked to determine if the testing voltage has been conducted through to the other test pad 38 through the circuit under test. When the testing voltage has been applied to each of the selected test pads 38 in this way, the circuit assembly 28 is raised using the Z actuator 22. Then the XY actuator 25 is used to move the circuit assembly 28 to the next stopping point 112 in the motion pattern 108. Next, the circuit test assembly 28 is again lowered with the Z-actuator 22 to be forcibly held against the circuit under test, and the electrical circuit testing process described above is repeated. This process of moving the circuit assembly 28 along the path 114 to the next stopping point 112 and of performing electrical circuit testing sequence is repeated until tests have been performed at each of the stopping points 112.

In this way, sequential patterns of test data are developed, representing the electrical connections occurring among the various test pads 38 in contact with the circuit under test at the stopping points 112. This data is stored and compared to an exemplary sequence of data patterns representing the connections which should occur during this sequence of movement in the absence of open circuit and short circuit conditions. A particularly efficient method for developing the exemplary sequence of data resides in the application of the same testing processes, including both movement along the path 114 and the electrical measurements.

Small variations in the location of the circuit under test may result in changes in the sequence in which test data patterns are developed or in changes in certain of the test data patterns. Therefore, logical means are preferably provided for comparing individual test data patterns with multiple patterns within the exemplary sequence, and for further basing a determination of whether the circuit under test has passed the testing process on a predetermined percentage of matches occurring between the test data patterns and the exemplary data patterns.

FIG. 9 is a vertical cross-sectional elevation of a test fixture, generally indicated as 126, built in accordance with a second embodiment of the present invention. This test fixture 126 is particularly configured to perform tests on circuits which are substantially larger than the circuits which can be tested using the test fixture 10 of FIG. 1. This capability is provided through the use of a number of testing circuit assemblies 128, 129 arranged in a rectangular array along a movable frame 130.

FIG. 10 is a bottom plan view of a flexible membrane 132, forming a portion of the testing circuit assembly 128 (shown in FIG. 9). This flexible membrane 132 has a first type of pattern 134 of test pads 38 separated by intervening insulating spaces 39 in the manner described above in reference to FIG. 2.

FIG. 11 is a bottom plan view of a flexible membrane 136, forming a portion of the testing circuit assembly 129 (shown in FIG. 9) This flexible membrane 132 has a second type of pattern 138 of test pads 38 separated by intervening insulating spaces 39. The outer corner positions 140 of the first type of pattern 134 are filled by test pads 38, while the four outer corner positions 142 of pattern 138 are filled with insulating spaces 39. The flexible membranes 136, 136 are otherwise identical.

Referring to FIGS. 9–11, the testing circuit assemblies 128, 129 are assembled to the movable frame 130 in an alternating manner in both the X-direction of arrow 144 and in a Y-direction perpendicular to both the X-direction and a Z-direction of arrow 146. In this way, the patterns 134, 138 of alternating test pads 38 and insulating spaces 39 are combined to produce a larger pattern of alternating test pads 38 and insulating spaces 39. Each flexible membrane 132, 136 has a cruciform shape, with relatively long tabs 148 extending opposite from one another and perpendicularly from relatively short tabs 150.

Figure 12:
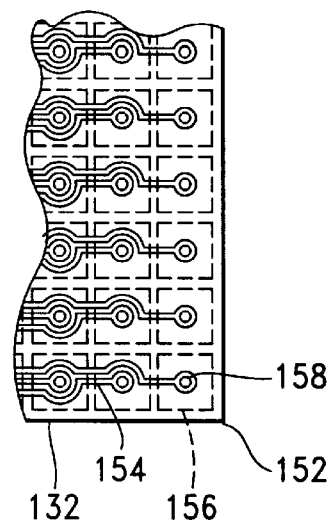
FIG. 12 is a fragmentary top plan view of a corner portion of the flexible membrane of FIG. 10, showing provisions for the attachment thereto of a connector.

FIG. 12 is a fragmentary top plan view of the flexible membrane 132, viewed at a corner 152 to show a number of circuit lines 154 making connections to connector mounting pads 156 through via holes 158.

Referring to FIGS. 10–12, both the test pads 38 and the connector mounting pads 156 extend along the lower surface 160 of the flexible membrane 132. The circuit lines 154 extend along the upper surface of the flexible membrane 132, being connected individually to test pads 38 in the manner described above in reference to FIG. 3 for circuit lines 45. In this manner, each test pad 38 is electrically connected to an associated connector mounting pad 156. Similar connections are made to the individual test pads 38 within the test pad pattern 138. In FIGS. 10 and 11, the patterns of connector mounting pads 156 are represented by cross-hatched areas 162.

Figure 13:
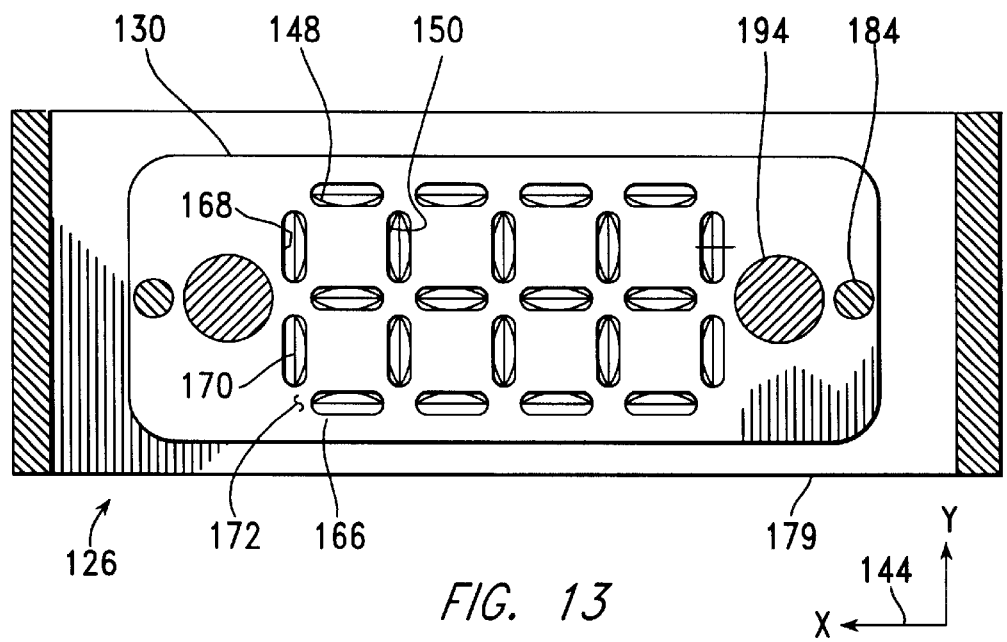
FIG. 13 is a horizontal cross-sectional view of the circuit test fixture of FIG. 9, taken as indicated by section lines XIII—XIII therein, to show provisions for routing tab portions of the flexible membranes of FIGS. 10 and 11.

FIG. 13 is a horizontal cross-sectional view of the test fixture 126, taken as indicated by section lines XIII—XIII in FIG. 9, particular to show provisions made in the movable frame 130 for the upward routing therethrough of flexible membrane tabs 148, 150.

Referring to FIGS. 9, 10, and 13, the test fixture 126 includes a number of elastomeric pads 164, arranged in an array along the lower surface 166 of the movable frame 130, providing a soft and flat surface upon which each of the flexible membranes 132, 136 are mounted, with tabs 148, 150 extending upward between adjacent elastomeric pads 164 and through slots 166 in the movable frame 160. Each slot 166 includes a widened portion 168 and a narrow portion 170. The narrowed portions 170 meet at adjacent corners 172, but the widened portions 168 are separated at adjacent corners 172 providing for the mechanical integrity of the movable frame 130. Each of the tabs 148, 150 is curved to fit through a corresponding widened portion 168. One or more connectors 174 is/are attached to the end of each relatively short tab 150, with individual terminals (not shown) of each connector 174 being soldered to the associated connector mounting pads 156 by a surface mounting process. Similarly, one or more connectors 176 is/are attached to the end of each relatively long tab 148, with the individual terminals (not shown) of each connector 176 being soldered to the associated connector mounting pads 156. This process of attaching connectors 174, 176 to each flexible membrane 132 forms a testing circuit assembly 128. Similarly, this process of attaching connectors 174, 175 to each flexible membrane 136 forms a testing circuit assembly 129.

The various connectors 174 are connected to flexible cables 177, which rise through an opening 178 in a stationary frame 179. Similarly, the various connectors 176 are connected to flexible cables 180, which also rise through the opening 178. Operation of the electrical test processes occurs generally as described above, with the test fixture 128 replacing the test fixture 10 in the testing apparatus of FIG. 6. Thus, the circuit lines within cables 177, 180 are connected to the multiplexer 82, with a test voltage being applied to a selected test pad 38 while other test pads are checked to determine if the test voltage is conducted through the circuit under test.

At each end, the movable frame 130 is attached to a stationary frame 179 by means of a post 181 extending downward from Z actuator 182, which is in turn mounted to an XY actuator 184. The Z actuators 182 are operated together to bring the testing circuit assemblies 128, 129 into engagement with a circuit under test extending along the top surface 186 of a substrate 188. The XY actuators 182 are driven together to move the movable frame 130 in the X- and Y-directions, and separately to effect rotation of the movable frame 130 within the stationary frame 179. Releasable clamps 181 are provided to hold the substrate 188 in place on the stationary frame 179.

Referring additionally to FIG. 6, additional drivers 68, 72, 76 are preferably provided for operation of the additional actuators 182, 184. Alternatively, the two Z-drivers 182 may be operated through a single Z driver 76, and the X-direction functions of the two XY actuators 182 may be operated through a single X-driver 68.

Referring to FIGS. 8 and 9, adjacent testing circuit assemblies 128, 129 are preferably separated by a minimal spacing, which nevertheless increases the area of uncertainty caused by the cell size "C" and by the fact that the areas used as test points in the circuit under test are not assumed to be in alignment with the test pads 38. To compensate for this effect, size of the pattern 108 of movement of the testing circuit assemblies 128, 129 is increased beyond the cell size "C" by an amount equal to the maximum spacing between adjacent circuit assemblies 128, 129. If necessary, additional stopping points 112 are included in the pattern 108.

The use of separate XY actuators 184 at opposite ends of the movable frame 103 provides a means for moving the circuit testing circuit assemblies 128, 129 into alignment in both translation and rotation with the circuit under test on the upper surface 186 of substrate 188. This facility, which makes it unnecessary to mount the substrate 188 in fixturing having an accurate relationship between the testing circuit assemblies 128, 129 and the circuit under test, is particularly useful when the substrate 188 lacks features, such as the holes 43 (shown in FIG. 1), precisely located in relationship with the circuit under test.

In a first example of the use of the test fixture 126, the upper surface 186 of the substrate 188 is provided with optically visible reference markings having a precise relationship with respect to the circuit under test. For example, such markings are composed of a cross near one end of the substrate 188 and a line extending toward the cross at the other end of the substrate 188. The test fixture 179 includes a pair of television cameras 194 which are located to view the reference markings at each end of the substrate 188. After the substrate 188 is clamped in place on the stationary frame 179, the camera 194 viewing the cross is used to provide positional feedback as the XY actuators 184 are used to align the movable frame 130 in the X- and Y-directions, so that the intersection of the lines forming the cross is viewed in a pre-determined position by this camera 194. Next, the other camera 194, viewing the line, is used to provide positional feedback as the XY actuator 184 nearest this other camera 194 is used to rotationally align the frame 130 with the reference markings, with the frame 130 being moved so that the line extends across a pre-determined position as it is viewed by this other camera 194. After the frame 130 is aligned with the circuit to be tested in this way, the Z actuators 182 are used to lower the movable frame 130, beginning the circuit testing process, which continues as explained above, as a test voltage is sequentially applied to selected test pads 38. The XY actuators 184 are used to move the movable frame 130 according to the movement pattern 108, and the Z actuators 182 are used to bring the circuit patterns 134, 138 into contact with the circuit under test and to raise the movable carriage 130 when motion in the X- or Y-direction is to occur.

In a second example of the use of the test fixture 126, areas used as test points within the circuit to be tested are used to align the movable frame 130 with the circuit to be tested. For example, first and second areas corresponding to test points at opposite ends of the circuit to be tested, when these first and second areas are electrically connected through the circuit under test, may be used in this way. First a test voltage is applied to a pre-selected group of test pads 38 adjacent the first such area on the circuit to be tested. As this voltage is applied sequentially to each of these test pads 38, the test pads 38 in the second area are each checked to determine if the test voltage is being applied through the circuit under test. The pattern 108 of movements described above in reference to FIG. 8 is applied, so that a complete set of data relative to these groups of test pads 38 is generated. Next, this data is used to determine the positions of the first and second areas on the circuit under test relative to the grid formed by testing circuit assemblies 128, 129. Next, the frame 130 is aligned with the circuit to be tested, and the circuit testing process continues as described in the proceeding paragraph relative to the first example.

In some circumstances, it may be both possible and desirable to use the location error data developed from the cameras 150, or from the use of circuit test points to determine the location error, to modify the data taken from a test sequence made without moving the movable frame 130 to correct for linear and angular location errors. Thus, the data image may be rotated and translated as needed to compensate for such errors. If angular errors can be prevented, it is particularly easy to compensate only for linear errors, which generally only result in differences in the sequencing of data patterns determined during the application of the motion pattern 108.

As described above relative to the operation of the circuit testing system of FIG. 6 with the circuit testing fixture 10 built in accordance with the first embodiment, the circuit testing process using the testing fixture 126 preferably includes a comparison of measurements of the circuit under test taken with the testing fixture with exemplary data representing a good circuit of the same kind. The exemplary data may be calculated from the circuit design, or it may be generated by measuring a circuit of the same kind known to be good in the same circuit testing system. In either case, the exemplary data may be calculated or generated to include data representing measurements made as the circuit under test is incrementally rotated in the X-Y plane extending perpendicular to the Z-axis. For example, a substrate 188 including a circuit known to be good is clamped to the stationary frame 179, and a number of circuit tests are made, with the movable frame 130 being rotated through the use of XY actuators 184. Following each such rotation, the movable frame 130 is lowered using the Z-actuators 182, and a set of test data is generated, with the movable frame 130 being moved through the pattern 108 between measurements made at stopping points 112. Each set of data is associated with an angular measurement derived using the cameras 194 or with the relative position of the first and second areas used, as described above, to determine the angular positioning of the circuit under test.

Next, a number of substrates 188 having similar circuits for testing are sequentially clamped in the testing fixture 126. Electrical measurements are made of each such circuit without changing the angular position of the movable frame 130. The angular position of each such circuit is measured using the cameras 194 or the relative position of the first and second areas, as described above. The test data from each of the circuits being tested is compared with the set of exemplary data measured with the known good circuit at an angle most closely matching that of the circuit being tested.

While the invention has been described in its preferred forms or embodiments with some degree of particularity, it is understood that this description has been given only by way of example and that numerous changes in the details of construction, fabrication, and use, including the combination and arrangement of parts, may be made without departing from the spirit and scope of the invention. For example, various elements of the test fixture 126, such as the cameras 194 or the ability to rotate the test pad pattern relative to the circuit under test, may be applied individually or in combination to the test fixture 10.

What is claimed is:

1. A method for testing a circuit to be tested on a substrate, wherein said circuit to be tested includes a plurality of test areas extending along a surface of said substrate, and wherein said method comprises steps of:
   a) clamping said substrate in place within a test fixture;
   b) moving a circuit testing assembly into contact with said test areas, wherein said circuit testing assembly includes a first plurality of conductive test pads, wherein various conductive test pads within said first plurality thereof are moved into contact with various of said test areas, and wherein conductive test pads within said first plurality thereof are placed in said circuit testing assembly in a rectangular array, alternating with insulating surfaces, with all adjacent conductive test pads and insulating surfaces being spaced at a common cell distance;
   c) applying a test signal sequentially to various conductive test pads within said first plurality thereof, while forming determinations of whether said test signal is conducted through said circuit to other conductive test pads within said first plurality thereof, and while storing results of said determinations;
   d) moving said circuit testing assembly out of contact with said test areas;
   e) moving said circuit testing assembly parallel to said surface along a portion of a predetermined pattern of motion wherein said predetermined pattern of motion extends within a square having sides equal to said common cell distance; and
   f) repeating steps b) through e) until movement along said predetermined pattern of motion has been completed.

2. The method of claim 1, wherein said pattern of motion comprises a raster scan having equally spaced stopping positions.

3. The method of claim 1, additionally comprising, following step f), a step of:
   g) comparing said results of said determinations with exemplary data to indicate whether said circuit is satisfactory.

4. The method of claim 3, wherein said exemplary data is generated by applying said steps a) through f) to an exemplary circuit known to be satisfactory and similar to said circuit to be tested.

5. The process of claim 1, wherein said circuit testing assembly is moved along an entire length of said predetermined pattern of motion before testing said circuit on said substrate is completed.

6. Apparatus for testing a circuit to be tested on a substrate, wherein said circuit to be tested includes a plurality of test areas extending along a surface of said substrate, and wherein said apparatus comprises:
   a rectangular array of conductive test pads alternating with insulating surfaces, wherein all adjacent conductive test pads and insulating surfaces are spaced at a common cell distance, and wherein all conductive test pads are electrically insulated from one another;

a Z-actuator providing relative movement bringing said rectangular array of conductive test pads and said substrate into engagement with one another and separating said rectangular array of conductive test pads and said substrate from one another;

a first XY actuator providing relative movement between said rectangular array of conductive test pads and substrate in directions parallel to said surface of said substrate; and a test circuit applying a test voltage sequentially to various of said conductive test pads while checking for conduction of said test voltage to various others of said conductive test pads.

7. Apparatus for testing a circuit to be tested on a substrate, wherein said circuit to be tested includes a plurality of test areas extending along a surface of said substrate, and wherein said apparatus comprises:

a rectangular array of conductive test pads alternating with insulating surfaces, wherein all adjacent conductive test pads and insulating surfaces are spaced at a common cell distance, and wherein all conductive test pads are electrically insulated from one another;

a flexible insulating membrane, wherein said rectangular array of conductive test pads is formed as a coating on said flexible insulating membrane;

a mounting plate, coextensive with said rectangular array of conductive test pads, supporting said flexible insulating membrane;

an elastomeric pad, coextensive with said rectangular array of conductive test pads, extending between said mounting plate and said flexible insulating membrane, and resiliently supporting said flexible insulating membrane;

a Z-actuator providing relative movement bringing said rectangular array of conductive test pads and said substrate into engagement with one another and separating said rectangular array of conductive test pads and said substrate from one another;

a first XY actuator providing relative movement between said rectangular array of conductive test pads and substrate in directions parallel to said surface of said substrate; and a test circuit applying a test voltage sequentially to various of said conductive test pads while checking for conduction of said test voltage to various others of said conductive test pads.

8. The apparatus of claim 7, wherein said apparatus additionally comprises a plurality of connectors, each of which includes a plurality of contact terminals, and said flexible insulating membrane includes a tabular portion extending outward, attached to a connector within said plurality thereof, from each side of said rectangular array of conductive test pads, and a plurality of circuit lines extending along each said tabular portion, electrically connecting terminals within said connector attached to said tabular portion with a plurality of conductive test pads closest to said tabular portion.

9. The apparatus of claim 6, additionally including:

a computing system executing a program, storing data representing said circuit to be tested, and controlling operation of said Z-actuator, said X-Y actuator, and said test circuit, a display unit having a screen, wherein said computing system executing said program causes said display unit to display on said screen a pattern of shaded areas corresponding to said conductive test pads and a circuit pattern image corresponding to said circuit to be tested, and a pointing device causing movement of a cursor on said screen, wherein a selection of corners of an area on said screen causes said computing system to operate said test circuit to apply said test voltage sequentially to various of said conductive test pads only within an area on said flexible insulating membrane corresponding to said area on said screen, while checking for conduction of said test voltage to various others of said conductive test pads only within said area on said flexible insulating membrane corresponding to said area on said screen.

* * * * *